(12) United States Patent
Bellini et al.

(10) Patent No.: US 12,501,666 B2
(45) Date of Patent: Dec. 16, 2025

(54) POWER SEMICONDUCTOR DEVICE WITH AN INSULATED TRENCH GATE ELECTRODE

(71) Applicant: Hitachi Energy Ltd, Zürich (CH)

(72) Inventors: Marco Bellini, Zürich (CH); LArs Knoll, Hägglingen (CH); Gianpaolo Romano, Baden (CH)

(73) Assignee: HITACHI ENERGY LTD, Zurich (CH)

( * ) Notice: Subject to any disclaimer, the term of this patent is extended or adjusted under 35 U.S.C. 154(b) by 385 days.

(21) Appl. No.: 18/039,907

(22) PCT Filed: Nov. 30, 2021

(86) PCT No.: PCT/EP2021/083558
§ 371 (c)(1),
(2) Date: Jun. 1, 2023

(87) PCT Pub. No.: WO2022/117560
PCT Pub. Date: Jun. 9, 2022

(65) Prior Publication Data
US 2024/0021670 A1    Jan. 18, 2024

(30) Foreign Application Priority Data
Dec. 3, 2020   (EP) .................................. 20211584

(51) Int. Cl.
*H10D 62/10*    (2025.01)
*H10D 12/00*    (2025.01)
(Continued)

(52) U.S. Cl.
CPC ......... *H10D 62/109* (2025.01); *H10D 12/481* (2025.01); *H10D 30/668* (2025.01); *H10D 62/127* (2025.01); *H10D 62/8325* (2025.01)

(58) Field of Classification Search
CPC .......................... H10D 62/109; H10D 30/668
See application file for complete search history.

(56) References Cited

U.S. PATENT DOCUMENTS

| 5,929,481 A | 7/1999 | Hshieh et al. |
| 6,627,950 B1 | 9/2003 | Bulucea et al. |

(Continued)

FOREIGN PATENT DOCUMENTS

| CN | 103262247 A | 8/2013 |
| CN | 108735817 A | 11/2018 |

(Continued)

*Primary Examiner* — Ali Naraghi
(74) *Attorney, Agent, or Firm* — PROCOPIO, CORY. HARGREAVES & SAVITCH LLP

(57) ABSTRACT

A power semiconductor device (1) comprising a semiconductor body (2) extending in a vertical direction between a first main surface (21) and a second main surface (22), a trench (4) extending from the first main surface (21) into the semiconductor body (2) in the vertical direction, and an insulated trench gate electrode (3) that is formed on the first main surface (21) and extends into the trench (4) is specified, wherein the trench (4) is subdivided along a main extension direction of the trench (4) in a plurality of segments (41) and the insulated trench gate electrode (3) continuously extends over the plurality of segments (41).

12 Claims, 4 Drawing Sheets

Figure 1A:
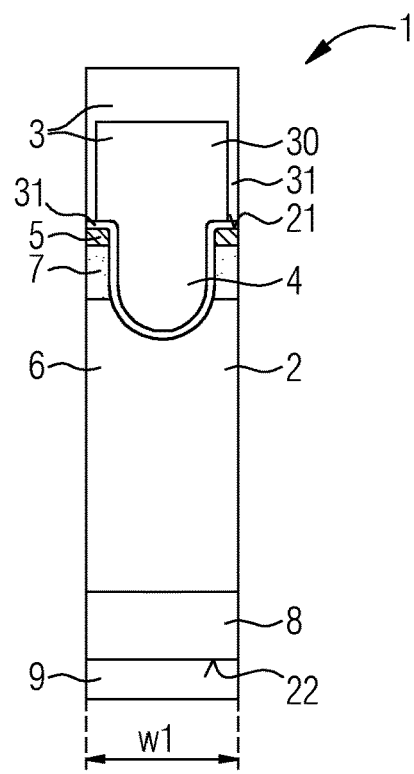
Figure 1B:
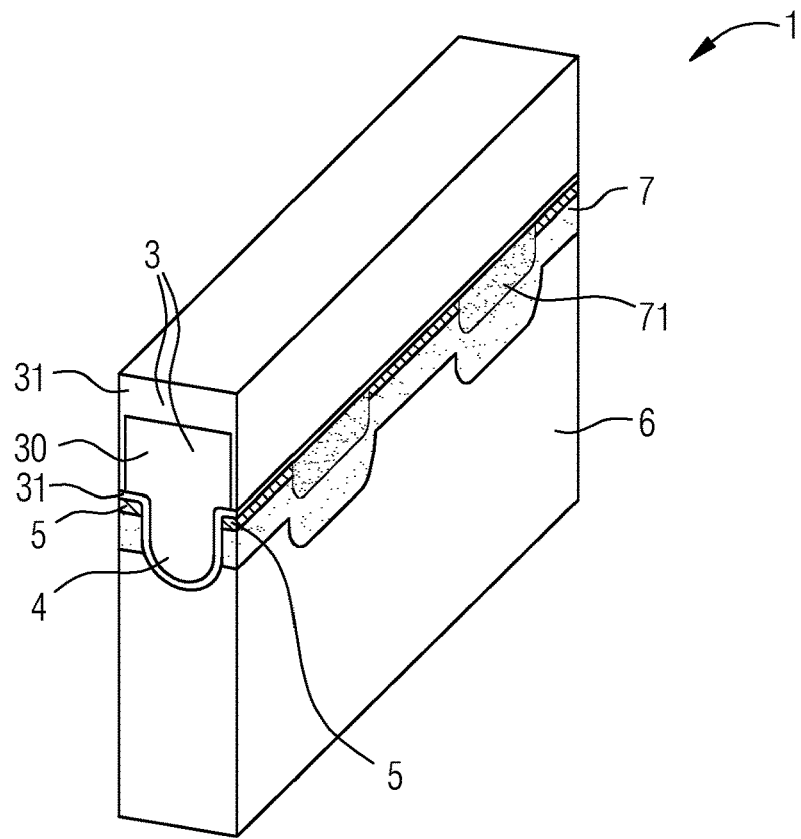
Figure 1C:
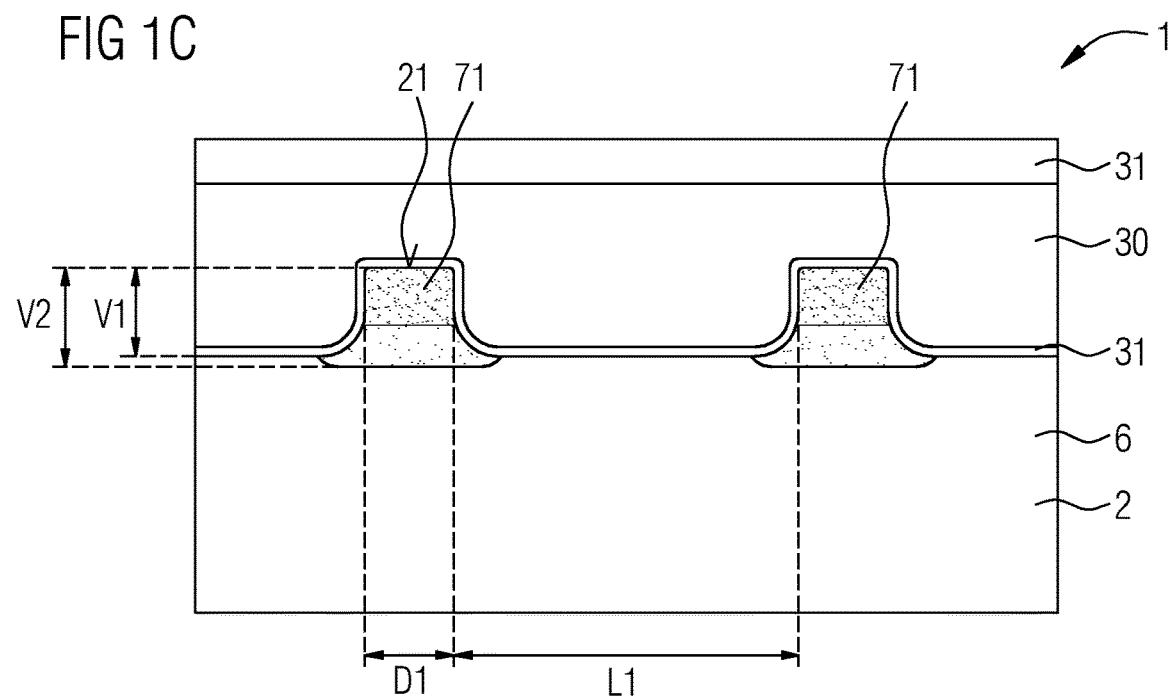

(51) Int. Cl.
*H10D 30/66* (2025.01)
*H10D 62/832* (2025.01)

(56) References Cited

U.S. PATENT DOCUMENTS

| | | |
|---|---|---|
| 2007/0181939 A1 | 8/2007 | Huang et al. |
| 2013/0056822 A1* | 3/2013 | Senoo ................ H10D 12/481 |
| | | 257/E29.256 |
| 2016/0336443 A1 | 11/2016 | Sumida et al. |
| 2018/0108774 A1* | 4/2018 | Chun ................ H01L 21/26506 |
| 2019/0140094 A1* | 5/2019 | Kurokawa ........... H10D 62/393 |
| 2019/0267247 A1* | 8/2019 | Kubota .............. H10D 30/0297 |
| 2022/0384566 A1* | 12/2022 | Saitoh ................ H10D 62/127 |

FOREIGN PATENT DOCUMENTS

| | | |
|---|---|---|
| CN | 109755294 A | 5/2019 |
| JP | 2007523487 A | 8/2007 |
| JP | 2016219495 A | 12/2016 |
| WO | 2005/081323 A2 | 9/2005 |
| WO | 2012/124056 A1 | 9/2012 |

\* cited by examiner

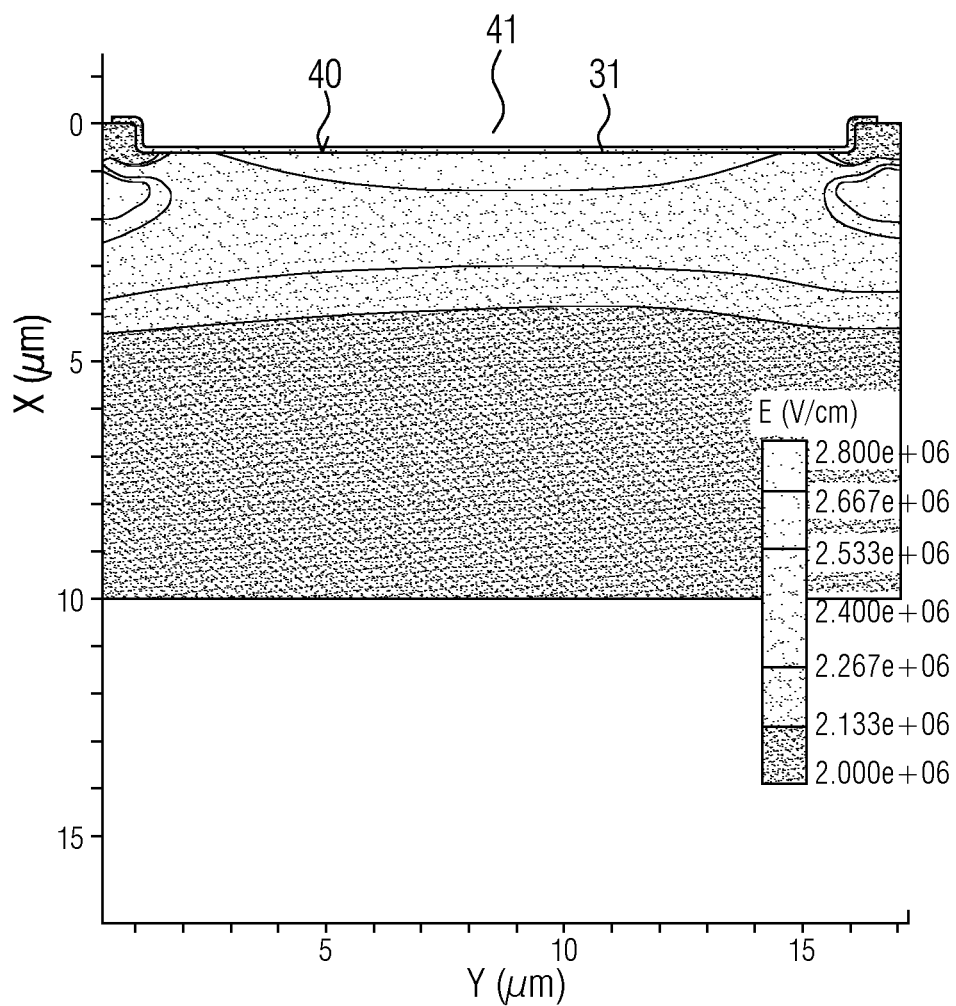

POWER SEMICONDUCTOR DEVICE WITH AN INSULATED TRENCH GATE ELECTRODE

CROSS-REFERENCE TO RELATED APPLICATIONS

This application is US National Stage of International Patent Application PCT/EP2021/083558, filed Nov. 30, 2021, which claims priority to European Patent Application No. 20211584.6, filed on Dec. 3, 2020, the contents of which is incorporated herein by reference.

The present invention relates to a power semiconductor device with an insulated trench gate electrode.

Compared to planar power semiconductor devices, semiconductor devices with an insulated trench gate electrode may offer a higher channel density. By decreasing the pitch between adjacent trenches, lower on-state losses may be obtained due to the paralleling of many channels per unit area.

However, the trench is vulnerable to the peak electrical field. One option to protect the gate oxide on the bottom of the trench is to provide a $p^+$-region arranged on a side of the trench that is opposite an n-source region. However, this $p^+$-region cannot be used for conduction and limits the scaling of the pitch and therefore the obtainable drain to source resistance in the on-state, also referred to as $R_{DSon}$.

A problem to be solved is to specify a trench power semiconductor device that provides a protection of the trench at its bottom and a narrow pitch.

This object is obtained, inter alia, by a power semiconductor device according to claim 1. Developments and expediencies are subject of the further claims.

According to at least one embodiment of the power semiconductor device, the power semiconductor device comprises a semiconductor body extending in a vertical direction between a first main surface and a second main surface. The power semiconductor device further comprises a trench extending from the first main surface into the semiconductor body in the vertical direction and an insulated trench gate electrode that is formed on the first main surface and extends into the trench. The trench is subdivided along a main extension direction of the trench in a plurality of segments and the insulated trench gate electrode continuously extends over the plurality of segments.

For example, the semiconductor body comprises a source region of a first conductivity type arranged adjacent to the first main surface, a drift layer of the first conductivity type and a doped region of a second conductivity type different than the first conductivity type, wherein the doped region is arranged in regions in the vertical direction between the source region and the drift layer. A subregion of the doped region extends between two adjacent segments of the plurality of segments along the main extension direction. The subregion is more heavily doped than a region of the doped region that extends below the source region. Between the two adjacent segments the doped region extends deeper into the semiconductor body in the vertical direction than the trench.

Thus, the trench does not extend continuously on the first main surface along its main extension direction. The regions between the segments of the trench may be used to protect the bottom of the trench. Thus, regions beside the trench in a transverse direction provided to protect the trench may be dispensed with. Consequently, the pitch between adjacent trenches may be reduced.

"Transverse direction" shall mean a direction running in parallel to the first main surface and perpendicular to the main extension direction of the trench.

Exemplarily, the second main surface is opposite the first main surface in the vertical direction.

For example, the power semiconductor device is configured for operating at large electrical currents, for instance of at least hundred amperes and/or voltages of at least 500 V. For example, the voltage may be 600 V or 750 V or more.

According to at least one embodiment of the power semiconductor device, the semiconductor body comprises a source region of a first conductivity type arranged adjacent to the first main surface, a drift layer of a first conductivity type, and a doped region of a second conductivity type different than the first conductivity type, wherein the doped region is arranged in regions in vertical direction between the source region and the drift layer.

The first conductivity type may be n-type and the second conductivity type may be p-type. In this case, the drift layer and the source region are n-doped layers or regions whereas the doped region of the second conductivity type is p-type. Alternatively, the first conductivity type is p-type and the second conductivity type is n-type.

The term "layer" is not limited to an element formed on an underlying material, for instance by a coating or deposition process, but also includes a subregion of an element that differs from one or more adjacent subregions of the same element, for instance with respect to at least one of the material composition and the doping concentration. For example, differently doped subregions of a semiconductor wafer or of a semiconductor body formed from a semiconductor wafer are referred to as layers as well.

For example, the doped region of the second conductivity type or at least a subregion thereof has a maximum doping concentration of at least $1*10^{16}\,\mathrm{cm}^{-3}$ or at least $5*10^{16}\,\mathrm{cm}^{-3}$.

According to at least one embodiment of the power semiconductor device, the trench extends from the first main surface into the drift layer. For example, a portion of the insulated trench gate electrode is arranged in the same plane as a portion of the doped region of the second conductivity type. For example, an electrically conductive gate layer of the insulated trench gate electrode and the region of the second conductivity type are separated from one another by a gate insulation layer. The gate insulation layer may also separate the gate layer from at least one of the drift layer and the source region. Exemplarily, the gate insulation layer is also arranged on top of the gate layer.

For example, the power semiconductor device is a trench MOSFET.

A trench MOSFET (metal-oxide-semiconductor field-effect transistor) comprises on a source side a source region of a first conductivity type and a channel layer (or channel implant or implant layer) of a second conductivity type different than the first conductivity type. For example, the first main surface is located at the source side. The channel layer may be formed by the doped region of the second conductivity type. A contact in form of a source electrode contacts the source layer and the channel layer. An insulated trench gate electrode is arranged on the first main surface lateral to the source layer and the channel layer.

For example, the power semiconductor device is a trench IGBT.

A trench IGBT (insulated gate bipolar transistor) comprises on a source side (also called emitter side) a source region (also called emitter layer) of a first conductivity type and a base layer (also called channel implant or channel layer) of a second conductivity type different from the first conductivity type. For example, the first main surface is located at the source side. The base layer may be formed by the doped region of the second conductivity type. A contact in form of a source electrode (also called emitter electrode) contacts the source layer and the channel layer. An insulated trench gate electrode is arranged on the source side lateral to the source layer and the channel implant.

According to at least one embodiment of the power semiconductor device, a subregion of the doped region of the second conductivity type extends between two adjacent segments of the plurality of segments along the main extension direction. Thus, the doped region is arranged laterally beside the segments along the main extension direction.

For example, the subregion directly adjoins the first main surface. For example, the subregion is arranged laterally beside the source region.

By means of the subregion between adjacent segments of the trench, a protection of the bottom of the trench using a layer having the opposite conductivity type than the source region can be obtained. Thus, the subregion may shield the electrical field along the bottom of the trench. A protecting region arranged beside the trench in transverse direction may be dispensed with. This helps to reduce the pitch between adjacent trenches and to obtain a very high channel density without compromising on the reliability of the gate insulation layer.

For example, the doped region of the second conductivity type has a maximum doping concentration of at least $1*10^{17}$ $cm^{-3}$ or at least $2*10^{17}$ $cm^{-3}$.

According to at least one embodiment of the power semiconductor device, the subregion is more heavily doped than a region of the doped region extending below the source region. For example, the subregion is by a factor of 2 or a factor of 5 or a factor of 10 more heavily doped. A high doping concentration of the subregion facilitates the protection of the bottom of the trench.

According to at least one embodiment of the power semiconductor device, between adjacent segments the doped region of the second conductivity type extends deeper into the semiconductor body in the vertical direction than the trench. It has been found that this relative arrangement of the doped region and the trench helps to further improve the reliability of the gate insulation layer protection. For example, the doped region extends by at least 0.3 µm deeper into the semiconductor body in the vertical direction than the trench. If the doping concentration of the doped region does not abruptly decrease in vertical direction, for instance due to an implant tail of the dopants, the depth of the doped region between adjacent segments may be determined using that vertical position, where the doping concentration of the doped region of the second conductivity type has decreased to the doping concentration of the dopants of the first conductivity type in the drift layer.

According to at least one embodiment of the power semiconductor device, between adjacent segments the doped region of the second conductivity type extends by between 0.5 µm and 1 µm deeper into the semiconductor body in the vertical direction than the trench.

According to at least one embodiment of the power semiconductor device, the source region is interrupted in a direction parallel to the main extension direction of the trench between two adjacent segments of the trench. In other words, the source region does not extend continuously over two adjacent segments of the trench along the main extension direction of the trench. For example, the source region only extends along a side face of the trench that extends along the main extension direction of the trench.

According to at least one embodiment of the power semiconductor device, the source region is arranged on both sides of the trench when seen along the transverse direction. In this case, both sides of the trench may be used for the source region.

According to at least one embodiment of the power semiconductor device, a depth of the trench in the vertical direction is between 0.5 µm and 1 µm inclusive.

According to at least one embodiment of the power semiconductor device, an extension of a segment of the plurality of segments along the main extension direction of the trench is between 2 µm and 20 µm inclusive, for example between 10 µm and 15 µm inclusive. A length of the segments of the trench is this range facilitates the protection of the bottom of the trench.

According to at least one embodiment of the power semiconductor device, an edge-to-edge distance between adjacent segments along the main extension direction is between 1 µm and 5 µm inclusive.

According to at least one embodiment of the power semiconductor device, a width of the power semiconductor device perpendicular to the main extension direction of the trench is between 1 µm and 6 µm inclusive. Consequently, a very high channel density can be obtained.

According to at least one embodiment of the power semiconductor device, the semiconductor body is based on silicon carbide (SiC).

"Based on SiC" means that the lattice sites of the crystal of the semiconductor body are predominantly, for example to at least 90%, occupied by silicon and carbon atoms. However, the semiconductor body comprises further constituents such as dopants or impurities.

Silicon carbide is a wide band gap material having a maximum breakdown electric field larger than that of silicon by about one order of magnitude. SiC is considered as an advantageous material for use in the manufacture of power semiconductor devices such as MOSFETs or IGBTs. However, other semiconductor materials such as silicon or other wide band gap materials such as gallium nitride (GaN) may also be used.

In the exemplary embodiments and figures similar or similarly acting constituent parts are provided with the same reference signs. Generally, only the differences with respect to the individual embodiments are described. Unless specified otherwise, the description of a part or aspect in one embodiment applies to a corresponding part or aspect in another embodiment as well.

Figure 1D:
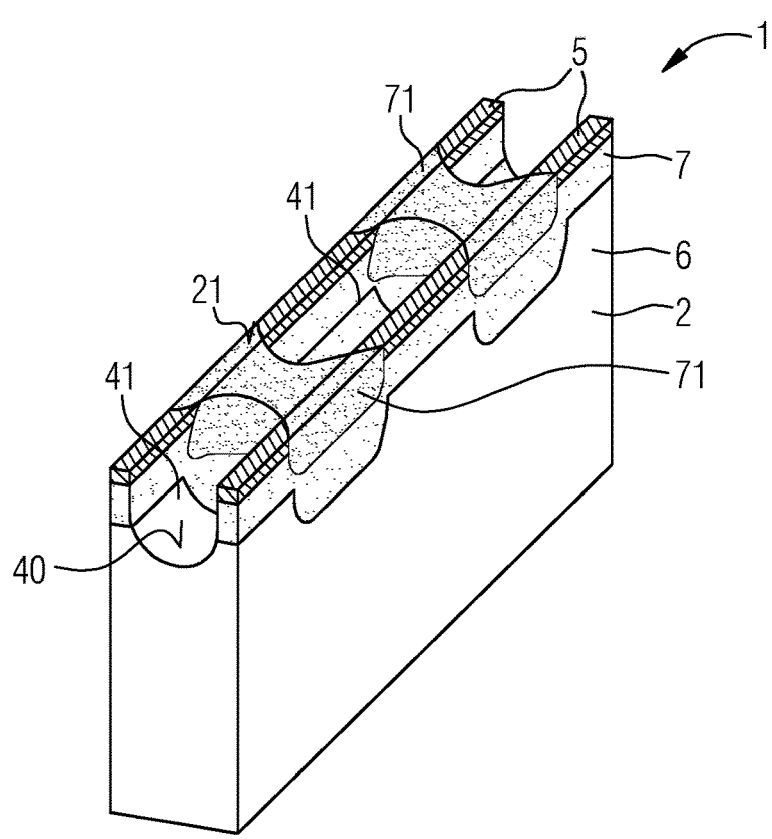
Figure 2A:
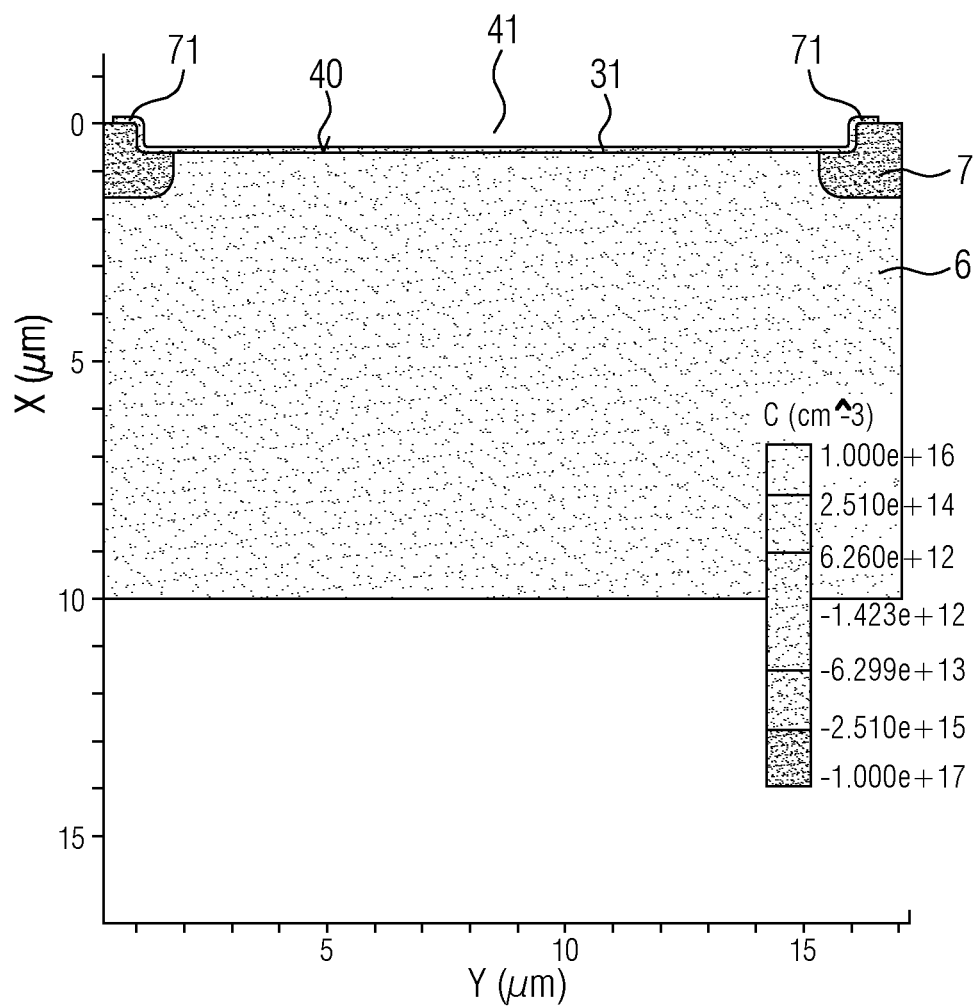

In the figures:

FIGS. 1A, 1B, 1C, and 1D show an exemplary embodiment of a power semiconductor device in a schematic side view (FIG. 1A), a perspective view (FIG. 1B), a sectional view along a main extension direction of the trench, and FIG. 1D a perspective view with an omitted insulated gate electrode;

FIG. 2A shows a distribution of the doping concentration C for an exemplary embodiment of a power semiconductor device along the main extension direction of the trench; and FIG. 2B shows simulation results of an electrical field distribution along the main extension direction of the trench for a power semiconductor device with the doping concentration distribution of FIG. 2A.

The elements illustrated in the figures and their size relationships among one another are not necessarily true to scale. Rather, individual elements or layer thicknesses may be represented with an exaggerated size for the sake of better representability and/or for the sake of better understanding.

An exemplary embodiment of a power semiconductor device is shown schematically in FIGS. 1A through 1D. The power semiconductor device 1 comprises a semiconductor body 2 extending in a vertical direction between a first main surface 21 and a second main surface 22 opposite the first main surface 21. A trench 4 is formed in the semiconductor body 2, extending from the first main surface 21 into the semiconductor body 2 in vertical direction. An insulated trench gate electrode 3 comprising an electrically conductive gate layer 30 and a gate insulation layer 31 is formed on the first main surface 21 and extends into the trench 4. The gate insulation layer 31 electrically insulates the gate layer 30 from the semiconductor body 2.

The trench 4 is subdivided along its main extension direction in a plurality of segments 41. Along the main extension direction the segments 41 are spaced apart from one another.

The insulated trench gate electrode (3) continuously extends over the plurality of segments (41).

Along the main extension direction the trench 4 with its segments 41 extends from one side face delimiting the power semiconductor device along the main extension direction to an opposite side face of the power semiconductor device 1.

The semiconductor body 2 comprises a source region 5 of a first conductivity type, a drift layer 6 of the first conductivity type and a doped region 7 of a second conductivity type different than the first conductivity type. For example, the source region 5 and the drift layer 6 are n-type and the doped region 7 is p-type.

The semiconductor body 2 further comprises a bottom layer 8 adjacent to the second main surface 22 (FIG. 1A). At the second main surface 22 a bottom electrode 9 is arranged. For the sake of easier representation the bottom layer 8 and the bottom electrode 9 are only shown in FIG. 1A.

The power semiconductor device 1 may be a MOSFET or an IGBT, for instance. In a MOSFET the bottom layer 8 is of the first conductivity type and acts as a drain layer. In an IGBT the bottom layer 8 is of the second conductivity type and acts as a collector layer.

The segments 41 of the trench 4 can be seen in the perspective view of FIG. 1D where the insulated trench gate electrode 3 is omitted.

The segments 41 of the trench 4 extend through the doped region of the second conductivity type 7 into the drift layer 6.

The source region 5 is arranged on both sides of the segments 41 of the trench 4 when seen along a transverse direction running perpendicular to the main extension direction of the trench 4. Consequently, both sides of the segments 41 may be used for the n-source region 5.

However, as a departure therefrom the source region 5 may also be provided on only one side of the segments 41. Unlike in a cellular design, the source region 5 is not present at the side faces of the power semiconductor device 1 that delimiting the power semiconductor device along the main extension direction of the trench 4.

Between adjacent segments 41 the source region 5 is interrupted so that it does not extend continuously between adjacent segments 41 along the main extension direction of the trench 4.

The doped region 7 of the second conductivity type comprises a subregion 71 extending between two adjacent segments 41 of the trench 4. The subregion 71 directly adjoins the first main surface 21 of the semiconductor body. Thus, the subregion 71 is arranged laterally beside the source region 5 in regions. For example, the subregion directly adjoins the source region 5 in lateral direction.

The subregion 71 is more heavily doped than the doped region 7 of the second conductivity type in a region extending below the source region 5. By means of a comparably high doping concentration between adjacent segments 41 of the trench 4 the gate insulation layer 31 may be protected at a trench bottom 40 from excessive values for the electrical field in a blocking state. This is illustrated by way of the doping concentration distribution shown in FIG. 2A and the resulting electrical field distribution in the blocking state illustrated in FIG. 2B.

In the exemplary embodiment of FIG. 2A the trench has a depth V1 of 0.7 µm and a doped region 7 has a depth V2 of 1 µm so that the doped region 7 extends by 0.3 µm deeper into the semiconductor body 2 than the trench 4. Thus, the doped region 7 extends deeper into the semiconductor body 2 than the segments 41 of the trench 4.

The doping concentration C in the subregion 71 of the doped region 7 amounts to about $1*10^{17}$ cm$^{-3}$ in this example. The doping concentration of the drift layer 6 amounts to about $1*10^{16}$ cm$^{-3}$ in this example. Negative values in the scale of FIG. 2A represent a p-doping concentration, positive values represent an n-doping concentration.

The semiconductor body 2 is based on silicon carbide in this exemplary embodiment. However, other semiconductor materials may also be used, for example other wide band gap materials or silicon.

In FIG. 2A the segment 41 of the trench 4 has an extension along the main extension direction L1 of the trench of 15 µm.

The simulation results of FIG. 2B illustrate that the electrical field directly underneath the trench bottom 40 is significantly lower than the maximum electrical field. Thus, the electrical field is efficiently shielded, so that the gate insulation layer 31 at the bottom 40 of the segments 41 of trench 4 is protected.

Of course, the device parameters may be varied and do not have to correspond to those described in the above exemplary embodiments.

For example, a depth V1 of the trench 4 in vertical direction is between 0.5 µm and 1 µm inclusive.

An extension L1 of a segment 41 along the main extension direction of the trench 4 may be between 2 µm and 20 µm inclusive, for instance between 10 µm and 15 µm inclusive.

An edge-to-edge distance D1 between adjacent segments 41 along the main extension direction is between 1 µm and 5 µm inclusive, for example.

A width W1 of the power semiconductor device 1 perpendicular to the main extension direction of the trench 4 may be between 1 µm and 6 µm inclusive, for instance.

Using the described configuration, a very high channel density and a high reliability of the gate insulation layer 31 may be obtained at the same time.

This patent application claims the priority of European patent application 20211584.6, the disclosure content of which is hereby incorporated by reference.

The invention described herein is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

LIST OF REFERENCE SIGNS 1 power semiconductor device
2 semiconductor body 21 first main surface
22 second main surface
3 insulated trench gate electrode
30 gate layer
31 gate insulation layer
4 trench
40 trench bottom
41 segment
5 source region
6 drift layer
7 doped region
71 subregion
8 bottom layer
9 bottom electrode
L1 extension of the segment along main extension direction
D1 edge-to-edge distance between segments
V1 depth of the trench in vertical direction
V2 depth of the doped region
W1 width of the power semiconductor device

The invention claimed is:

1. A power semiconductor device comprising:
a semiconductor body extending in a vertical direction between a first main surface and a second main surface;
a trench extending from the first main surface into the semiconductor body in the vertical direction; and
an insulated trench gate electrode that is formed on the first main surface and extends into the trench;
wherein
the trench is subdivided along a main extension direction of the trench in a plurality of segments, so that the trench does not extend continuously on the first main surface;
the insulated trench gate electrode continuously extends over the plurality of segments;
the semiconductor body comprises a source region of a first conductivity type arranged adjacent to the first main surface;
the semiconductor body comprises a drift layer of the first conductivity type;
the semiconductor body comprises a doped region of a second conductivity type different than the first conductivity type, wherein the doped region is arranged in regions in the vertical direction between the source region and the drift layer;
a subregion of the doped region extends between two adjacent segments of the plurality of segments along the main extension direction;
the subregion is more heavily doped than a region of the doped region that extends below the source region; and between the two adjacent segments the doped region extends deeper into the semiconductor body in the vertical direction than the trench.

2. The power semiconductor device according to claim 1, wherein the trench extends from the first main surface into the drift layer.

3. The power semiconductor device according to claim 1, wherein the subregion directly adjoins the first main surface.

4. The power semiconductor device according to claim 1, wherein between the two adjacent segments the doped region extends by at least 0.3 μm deeper into the semiconductor body in the vertical direction than the trench.

5. The power semiconductor device according to claim 1, wherein between the two adjacent segments the doped region extends by between 0.5 μm and 1 μm deeper into the semiconductor body in the vertical direction than the trench.

6. The power semiconductor device according to claim 1, wherein the source region is interrupted in a direction parallel to the main extension direction of the trench between two adjacent segments of the trench.

7. The power semiconductor device according to claim 1, wherein the source region is arranged on both sides of the trench when seen along a transverse direction running in perpendicular to the main extension direction of the trench.

8. The power semiconductor device according to claim 1, wherein a depth of the trench in the vertical direction is between 0.5 μm and 1 μm inclusive.

9. The power semiconductor device according to claim 1, wherein an extension of a segment of the plurality of segments along the main extension direction of the trench is between 2 μm and 20 μm inclusive.

10. The power semiconductor device according to claim 1, wherein a width of the power semiconductor device perpendicular to the main extension direction of the trench is between 1 μm and 6 μm inclusive.

11. The power semiconductor device according to claim 1, wherein an edge-to-edge distance between adjacent segments along the main extension direction is between 1 μm and 5 μm inclusive.

12. The power semiconductor device according to claim 1, wherein the semiconductor body is based on SiC.

* * * * *